(12) United States Patent
Bu et al.

(10) Patent No.: US 12,550,626 B2
(45) Date of Patent: Feb. 10, 2026

(54) METHOD FOR PREPARING JOSEPHSON JUNCTION AND PRODUCTION LINE DEVICE

(71) Applicant: Tencent Technology (Shenzhen) Company Limited, Guangdong (CN)

(72) Inventors: Kunliang Bu, Guangdong (CN); Wenlong Zhang, Guangdong (CN); Dengfeng Li, Guangdong (CN)

(73) Assignee: Tencent Technology (Shenzhen) Company Limited, Shenzhen (CN)

(*) Notice: Subject to any disclaimer, the term of this patent is extended or adjusted under 35 U.S.C. 154(b) by 451 days.

(21) Appl. No.: 18/202,445

(22) Filed: May 26, 2023

(65) Prior Publication Data

US 2023/0320234 A1 Oct. 5, 2023

Related U.S. Application Data

(63) Continuation of application No. PCT/CN2023/077677, filed on Feb. 22, 2023.

(30) Foreign Application Priority Data

Mar. 29, 2022 (CN) .................. 202210324371.X

(51) Int. Cl.
*H10N 60/01* (2023.01)
*C23C 14/24* (2006.01)
(Continued)

(52) U.S. Cl.
CPC ......... *H10N 60/0912* (2023.02); *C23C 14/24* (2013.01); *C23C 14/5853* (2013.01); *G03F 7/70008* (2013.01); *G03F 7/70925* (2013.01)

(58) Field of Classification Search
CPC ... C23C 14/225; C23C 14/24; C23C 14/5853; G03F 7/70008; G03F 7/70925; H10N 60/0912

See application file for complete search history.

(56) References Cited

U.S. PATENT DOCUMENTS

| 2019/0363239 A1 | 11/2019 | Yoscovits et al. |
| 2020/0279990 A1 | 9/2020 | Burkett et al. |

(Continued)

FOREIGN PATENT DOCUMENTS

| CN | 111344875 | 6/2020 |
| CN | 111403590 | 7/2020 |

(Continued)

OTHER PUBLICATIONS

Korean-language Office Action issued in Korean Application No. 10-2023-7018391 dated Apr. 27, 2025 with English translation (16 pages).

(Continued)

*Primary Examiner* — Jaehwan Oh
(74) *Attorney, Agent, or Firm* — Crowell & Moring LLP

(57) ABSTRACT

A method and device for preparing a Josephson junction are provided. The method includes: preparing a photoresist film layer comprising an undercut structure on a substrate, the undercut structure comprising a first strip-shaped opening and a second strip-shaped opening; performing, at a first angle, evaporation on the photoresist film layer obliquely to the substrate, to prepare a first strip-shaped superconducting layer through the first strip-shaped opening; and performing, at a second angle, evaporation on the photoresist film layer obliquely to the substrate, to prepare a second strip-shaped superconducting layer through the second strip-shaped opening, the first strip-shaped superconducting layer and the second strip-shaped superconducting layer crossing each other, and an intersection of the first strip-shaped superconducting layer and the second strip-shaped superconducting layer being isolated by an oxidation layer to form a Josephson junction.

20 Claims, 9 Drawing Sheets

(51) Int. Cl.
*C23C 14/58* (2006.01)
*G03F 7/00* (2006.01)

(56) References Cited

U.S. PATENT DOCUMENTS

| | | | |
|---|---|---|---|
| 2021/0399199 A1 | 12/2021 | Adiga et al. | |
| 2022/0037578 A1 | 2/2022 | Rodbell et al. | |
| 2022/0328749 A1* | 10/2022 | Burkett | H10N 60/12 |

FOREIGN PATENT DOCUMENTS

| | | |
|---|---|---|
| CN | 111403590 A | 7/2020 |
| CN | 113257988 A | 8/2021 |
| CN | 113257989 A | 8/2021 |
| JP | 2004-507117 A | 3/2004 |
| JP | 2007-52932 A | 1/2007 |
| JP | 2020-535461 A | 12/2020 |
| JP | 6849858 B2 | 3/2021 |
| WO | WO 2023/139779 A1 | 7/2023 |

OTHER PUBLICATIONS

International Search Report issued May 16, 2023 in International (PCT) Application No. PCT/CN2023/077677.
Office action issued in Japanese application No. 2023-552351, dated Oct. 7, 2024, 12 pages (with English translation).
Office action issued in Korean application No. 10-2023-7018391, dated Aug. 30, 2024, 6 pages (with English translation).
Extended European Search Report issued in European application No. 23772736.7, dated Oct. 23, 2024, 12 pages.
Costache et al. "Lateral metallic devices made by a multiangle shadow evaporation technique," Journal of Vacuum Science, American Institute of Physics, Jul. 2012, 30(4):5 pages.

* cited by examiner

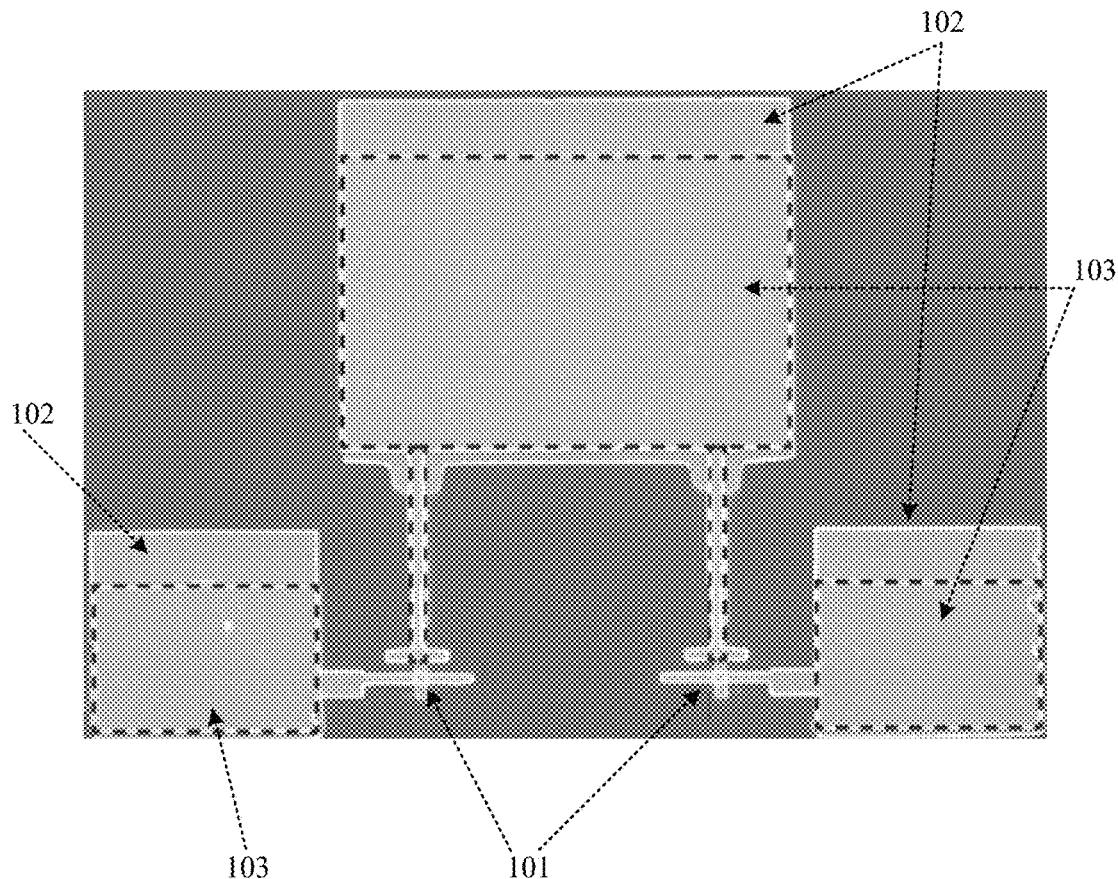

FIG. 1

201
Prepare a photoresist film layer including an undercut structure on a substrate; the undercut structure including a first strip-shaped opening and a second strip-shaped opening; and the first strip-shaped opening being not parallel to the second strip-shaped opening 202
Perform, at a first angle, evaporation on the photoresist film layer obliquely to the substrate, to prepare a first strip-shaped superconducting layer on the substrate through the first strip-shaped opening 203
Perform, at a second angle, evaporation on the photoresist film layer obliquely to the substrate, to prepare a second strip-shaped superconducting layer on the substrate through the second strip-shaped opening; the first strip-shaped superconducting layer and the second strip-shaped superconducting layer crossing each other; and an intersection of the first strip-shaped superconducting layer and the second strip-shaped superconducting layer being isolated by an oxidation layer to form a Josephson junction

FIG. 2

METHOD FOR PREPARING JOSEPHSON JUNCTION AND PRODUCTION LINE DEVICE

RELATED APPLICATION

This application is a continuation application of PCT Patent Application No. PCT/CN2023/077677, filed on Feb. 22, 2023, which claims priority to Chinese Patent Application No. 202210324371.X, filed with the Chinese Patent Office on Mar. 29, 2022 and entitled "METHOD FOR PREPARING JOSEPHSON JUNCTION AND PRODUCTION LINE DEVICE", wherein the content of the above-referenced applications is incorporated herein by reference in its entirety.

FIELD OF THE TECHNOLOGY

This disclosure relates to the field of micro-nano processing technologies, and in particular, to a method for preparing a Josephson junction and a production line device.

BACKGROUND OF THE DISCLOSURE

A Josephson junction is a currently commonly used quantum bit structure, and may be prepared using a pre-designed photoresist structure.

In a related technology, a Dolan bridge photoresist structure pattern including an undercut may be made on a double-layer electron beam photoresist on a surface of a substrate by using an electron beam exposure method, and then a Josephson junction is prepared by using a double-dip evaporation method in which a superconducting metal film is obliquely plated, then an insulating layer is oxidized, and then the superconducting metal film is vertically evaporated.

Then, in the foregoing solution for preparing a Josephson junction, an extra Josephson junction (also referred to as a parasitic junction) is introduced into a prepared quantum bit assembly, thereby affecting coherence of the quantum bit assembly.

SUMMARY

Embodiments of this disclosure provide a method for preparing a Josephson junction and a production line device, so as to improve coherence of a quantum bit assembly. Technical solutions are as follows:

According to one aspect, a method for preparing a Josephson junction is provided, and the method includes:

preparing a photoresist film layer comprising an undercut structure on a substrate, the undercut structure comprising a first strip-shaped opening and a second strip-shaped opening, and the first strip-shaped opening being not parallel to the second strip-shaped opening;

performing, at a first angle, evaporation on the photoresist film layer obliquely to the substrate, to prepare a first strip-shaped superconducting layer on the substrate through the first strip-shaped opening; and performing, at a second angle, evaporation on the photoresist film layer obliquely to the substrate, to prepare a second strip-shaped superconducting layer on the substrate through the second strip-shaped opening, the first strip-shaped superconducting layer and the second strip-shaped superconducting layer crossing each other, and an intersection of the first strip-shaped superconducting layer and the second strip-shaped superconducting layer being isolated by an oxidation layer to form a Josephson junction.

According to another aspect, a device is provided, where the device includes: a spin coater, a lithography machine, and an evaporation machine;

the spin coater and the lithography machine are configured to prepare a photoresist film layer comprising an undercut structure on a substrate, the undercut structure comprising a first strip-shaped opening and a second strip-shaped opening, and the first strip-shaped opening being not parallel to the second strip-shaped opening;

the evaporation machine is configured to perform, at a first angle, evaporation on the photoresist film layer obliquely to the substrate, to prepare a first strip-shaped superconducting layer on the substrate through the first strip-shaped opening; and the evaporation machine is further configured to perform, at a second angle, evaporation on the photoresist film layer obliquely to the substrate, to prepare a second strip-shaped superconducting layer on the substrate through the second strip-shaped opening, the first strip-shaped superconducting layer intersecting the second strip-shaped superconducting layer, and an intersection of the first strip-shaped superconducting layer, and the second strip-shaped superconducting layer being isolated by an oxidation layer to form a Josephson junction.

The technical solutions provided in the embodiments of this disclosure produce at least the following beneficial effects:

A photoresist film layer of an undercut structure is prepared on a substrate, where the undercut structure has two non-parallel strip-shaped openings, and two strip-shaped superconducting layers that cross each other and are separated by an oxidation layer are prepared on the substrate in the undercut structure by means of oblique evaporation at two different angles. In the foregoing solution, only one Josephson junction is formed at an intersection of two strip-shaped superconducting layers, and another parasitic junction is not brought, thereby improving coherence of a quantum bit assembly.

BRIEF DESCRIPTION OF THE DRAWINGS

FIG. 1 is a diagram of a preparation effect of a Josephson junction according to this disclosure.

FIG. 2 is a method flowchart of a method for preparing a Josephson junction according to an exemplary embodiment of this disclosure.

DESCRIPTION OF EMBODIMENTS

Figure 3:
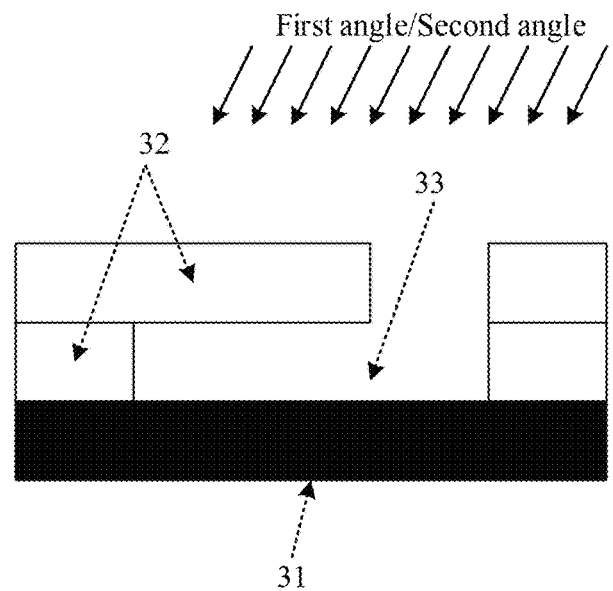
FIG. 3 is a schematic diagram of an undercut structure in the embodiment shown in FIG. 2.

Some definitions of terms in this disclosure are first described.

Quantum bit (Qubit): In quantum informatics, it is the unit of measure of quantum information.

Unlike a classical bit that can only be in one of states 0 and 1, a quantum bit may be in both a state of 0 and a state of 1, that is, a quantum superposition state of 0 and 1.

Josephson junction: A sandwich structure formed by stacking a superconducting layer, an insulating layer, and a superconducting layer, also referred to as a superconducting tunnel junction.

A Josephson junction is generally a structure in which two superconductors sandwich a very thin barrier layer (thickness≤coherence length of a Cooper electron pair), for example, an S (Superconductor)-I (semiconductor or insulator)-S (superconductor) structure, which is referred to as an SIS structure. In the Josephson junction, superconducting electrons can be tunneled from a superconducting layer on one side through a semiconductor or insulating film to a superconducting layer on the other side.

Parasitic junction: Other Josephson junctions brought about in the preparation of the Josephson junction.

Shadow evaporation: During evaporation, an evaporation material is incident on a surface of a substrate at a specific angle. In addition, a barrier of a specific shape is disposed in an incident path by defining a photoresist pattern, so that a film layer is selectively evaporated on some parts of the surface of the substrate, but a film layer is not plated on other parts.

Josephson junction patch: A part of a superconducting quantum chip that connects a Josephson junction to an external circuit.

Josephson junction bandage: A part of a superconducting quantum chip that connects a Josephson junction patch to an external circuit.

Ion milling: A surface of a material is bombarded with a directional ion beam to remove an oxidation layer on the surface of the material.

Oblique evaporation: A film is evaporated for an evaporation material in a direction not parallel to a substrate normal.

Straight evaporation: A film is evaporated for an evaporation material in a direction parallel to a substrate normal.

Lift off: A process in which a photoresist dissolves in a degumming solution, and a metal layer on the photoresist is also removed from a substrate.

Decoherence (coherence time): The ability of a quantum bit to maintain association between different quantum states.

Undercut structure (undercut): A pattern structure formed after a photoresist is developed, where a size of an upper opening is smaller than a size of a lower opening.

In situ: A multi-step process is performed in a single vacuum chamber or in a plurality of interconnected vacuum chambers in which a sample/product is not moved to an atmospheric environment.

Quantum computers have received wide attention because they are significantly faster than classical computers in dealing with some specific problems. Currently, an exemplary way to implement a quantum computer is a superconducting quantum computer. Superconducting quantum computers rely on superconducting quantum chips to implement logic gate operations. A superconducting quantum chip may be simply considered to be composed of an external circuit and a Josephson junction, where the Josephson junction is a core element of the superconducting quantum chip.

A method for preparing a Josephson junction is a shadow evaporation method for forming a Josephson junction by in situ ion milling, oblique incident evaporation, oxidation, and straight incident evaporation. Referring to FIG. 1, FIG. 1 is a diagram of a preparation effect of a Josephson junction according to this disclosure. FIG. 1 shows two Josephson junctions 101 in parallel, which are connected to an external circuit via a Josephson junction patch 102. As shown in FIG. 1, after ion milling, oblique incident evaporation, oxidation, and straight incident evaporation are performed in situ, a parasitic junction 103 is formed in a quantum bit assembly, and the parasitic junction is shown in a dashed line box part in FIG. 1.

As shown in FIG. 1, when a Josephson junction is prepared according to the foregoing solution, a large-area parasitic junction is introduced into a quantum bit assembly that includes the Josephson junction, thereby affecting decoherence of the quantum bit assembly, and further affecting performance of a quantum computing device.

To improve performance of a quantum bit assembly whose structure is a Josephson junction, subsequent embodiments of this disclosure provide a new Josephson junction preparation solution. The solutions provided in subsequent embodiments of this disclosure are applicable to preparation of a superconducting quantum chip such as a plane, flip chip bonding, or a multilayer stack.

Referring to FIG. 2, FIG. 2 is a method flowchart of a method for preparing a Josephson junction according to an exemplary embodiment of this disclosure. The method may be performed by a production line device. As shown in FIG. 2, the method may include the following steps:

Step 201: Prepare a photoresist film layer including an undercut structure on a substrate; the undercut structure including a first strip-shaped opening and a second strip-shaped opening; and the first strip-shaped opening being not parallel to the second strip-shaped opening.

The undercut structure may mean that different degrees of exposure are performed on a pattern designed in two or more layers of photoresist on the substrate, so as to form a cavity under an upper-layer photoresist, and form one or more opening photoresist structures less than the cavity in the upper-layer photoresist.

For example, referring to FIG. 3, FIG. 3 is a schematic diagram of an undercut structure according to an embodiment of this disclosure. As shown in FIG. 3, there are two layers of photoresist 32 on an upper layer of a substrate 31. After lithographic development is separately performed on different regions of the two layers of photoresist 32, an undercut structure 33 is formed. An area of a lower half of the undercut structure 33 is greater than an area of an upper half of the undercut structure 33.

In this embodiment of this disclosure, in the photoresist film layer that is of the undercut structure and that is prepared on the substrate, the undercut structure includes two strip-shaped openings, where the two strip-shaped openings are not parallel, that is, one ends of the strip-shaped openings are close to each other, and the other ends of the strip-shaped openings are far from each other.

Step 202: Perform, at a first angle, evaporation on the photoresist film layer obliquely to the substrate, to prepare a first strip-shaped superconducting layer on the substrate of the undercut structure through the first strip-shaped opening.

In this embodiment of this disclosure, a direction in which evaporation is performed at the first angle refers to a direction that is inclined to a normal direction of the substrate and that points to the substrate. With reference to the undercut structure shown in FIG. 3, it can be learned that, in a case in which the first angle is appropriate, the superconducting material that is obliquely evaporated in the normal direction of the substrate may partially pass through the opening in the upper part of the undercut structure, and be incident on the substrate in the undercut structure to form the superconducting layer (the other part of superconducting material that is obliquely incident on the opening is blocked by a side wall of the opening).

In this embodiment of this disclosure, because the first strip-shaped opening is a strip, correspondingly, the first strip-shaped opening is incident on the evaporation material of the first strip-shaped opening at the first angle, and a part that is not blocked by the photoresist on the upper layer of the undercut structure forms the first strip-shaped superconducting layer on the substrate.

Step 203: Perform, at a second angle, evaporation on the photoresist film layer obliquely to the substrate, to prepare a second strip-shaped superconducting layer on the substrate of the undercut structure through the second strip-shaped opening; the first strip-shaped superconducting layer and the second strip-shaped superconducting layer crossing each other; and an intersection of the first strip-shaped superconducting layer and the second strip-shaped superconducting layer being isolated by an oxidation layer to form a Josephson junction.

Similar to the first angle, a direction in which evaporation is performed at the second angle refers to another direction that is inclined to the normal direction of the substrate and that points to the substrate. The second strip-shaped superconducting layer is formed on the substrate in a part that is of the evaporation material incident in the second strip-shaped opening at the second angle and that is not blocked by the photoresist on the upper layer of the undercut structure.

Positions of the first strip-shaped superconducting layer and the second strip-shaped superconducting layer on the substrate are determined by an opening position of the undercut structure, a height of the upper-layer photoresist, a thickness of the upper-layer photoresist, and evaporation angles (that is, the first angle and the second angle). By designing the opening position of the undercut structure, the height of the upper-layer photoresist, the thickness of the upper-layer photoresist, and the evaporation angles, the first strip-shaped superconducting layer and the second strip-shaped superconducting layer cross each other on the substrate, and as long as a region in which the two strip-shaped superconducting layers cross each other is isolated by using an oxidation layer, a Josephson junction can be formed.

In the foregoing solution, because the Josephson junction is obtained by crossing two strip-shaped superconducting layers, another parasitic junction is not introduced.

In conclusion, in the solution shown in this embodiment of this disclosure, a photoresist film layer with an undercut structure is prepared on a substrate, where the undercut structure has two non-parallel strip-shaped openings, and two strip-shaped superconducting layers that cross each other and are separated by an oxidation layer are prepared on the substrate in the undercut structure by means of oblique evaporation at two different angles. In the foregoing solution, only one Josephson junction is formed at an intersection of two strip-shaped superconducting layers, and another parasitic junction is not brought, thereby improving coherence of a quantum bit assembly.

Figure 4:
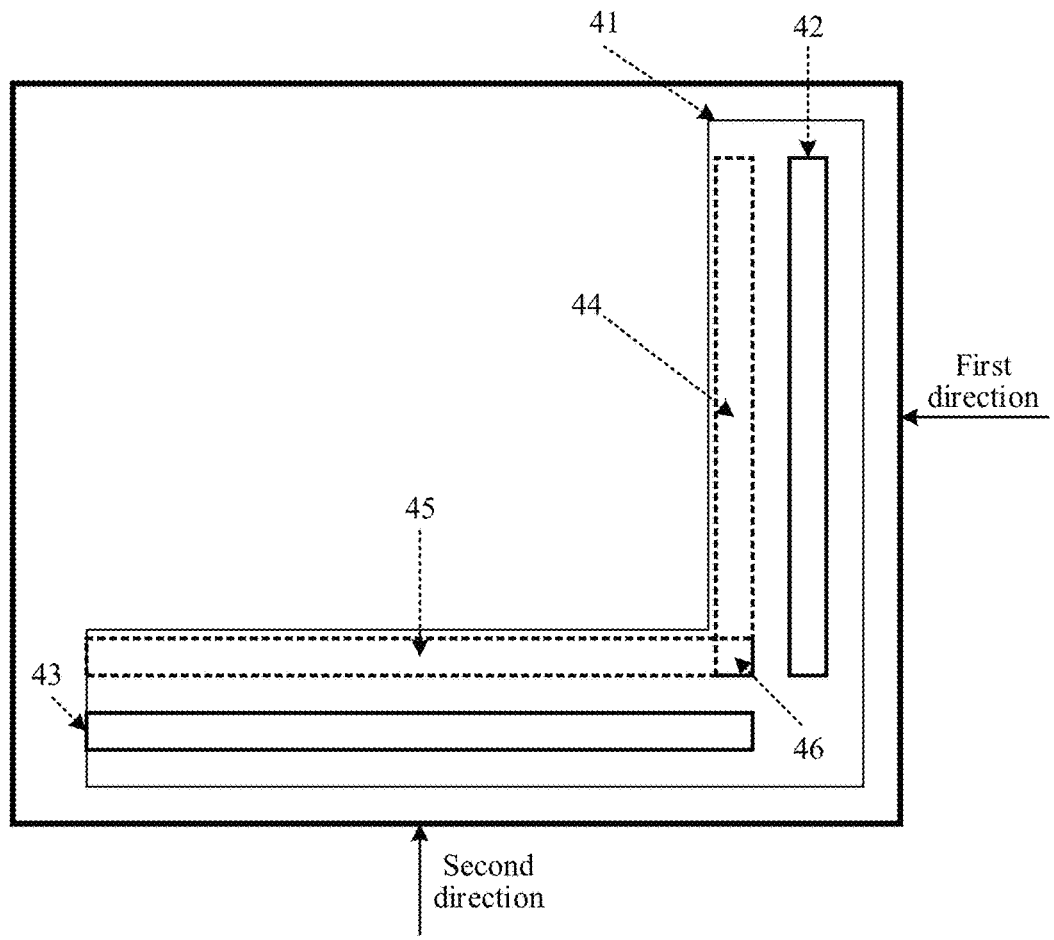
FIG. 4 is a flowchart of preparing a Josephson junction according to an exemplary embodiment of this disclosure.

Referring to FIG. 4, FIG. 4 is a flowchart of preparing a Josephson junction according to an exemplary embodiment of this disclosure. As shown in FIG. 4, a preparation process of a Josephson junction may be as follows:

S1. Prepare a photoresist film layer on a substrate, where the photoresist film layer includes an undercut structure, and the undercut structure includes two strip-shaped openings.

As shown in FIG. 4, a region in which the undercut structure on the substrate is located is a region 41, a lower part of the undercut structure is a cavity, and a part of the upper part other than a strip-shaped opening 42 and a strip-shaped opening 43 is a photoresist. A part outside the region 41 is filled with a photoresist.

S2. Successively perform oblique evaporation on the photoresist film layer at two different angles, where an evaporation material penetrates the two strip-shaped openings, and two strip-shaped superconducting layers that cross each other and are isolated by using an oxidation layer are formed on the substrate, to form a Josephson junction.

Because of oblique evaporation, positions of the strip-shaped superconducting layers formed on the substrate after superconducting materials that are evaporated at different angles respectively pass through the strip-shaped opening 42 and the strip-shaped opening 43 are deviated from projection positions of the strip-shaped opening 42 and the strip-shaped opening 43 on the substrate, so that two superconducting layers obtained by means of evaporation by using the strip-shaped opening 42 and the strip-shaped opening 43 that do not intersect may intersect to form a Josephson junction.

As shown in FIG. 4, that the strip-shaped opening 42 and the strip-shaped opening 43 are perpendicular to each other and do not intersect each other is used as an example. The first angle is an angle at which oblique incidence on the substrate is performed from the right side to the left side of the strip-shaped opening 42. When evaporation is performed at the first angle, the evaporation material penetrates the strip-shaped opening 42, and a strip-shaped superconducting layer 44 is formed on the substrate on the left side of the strip-shaped opening 42. The second angle is an angle at which oblique incidence on the substrate is performed from the bottom to the top of the strip-shaped opening. When evaporation is performed at the second angle, the evaporation material penetrates the strip-shaped opening 43, and a strip-shaped superconducting layer 45 is formed on the substrate above the strip-shaped opening 43. The first angle/the second angle may be shown in FIG. 3. When the strip-shaped opening 42 and the strip-shaped opening 43 are sufficiently close to each other, the strip-shaped superconducting layer 44 and the strip-shaped superconducting layer 45 may cross each other, and evaporated superconducting layers are oxidized between two times of oblique evaporation to obtain a Josephson junction 46 after the second time of oblique evaporation.

Based on the solution shown in FIG. 2, in this embodiment of this disclosure, in addition to preparing a Josephson junction without a parasitic junction, a Josephson junction patch may be further prepared without introducing the parasitic junction.

Figure 5:
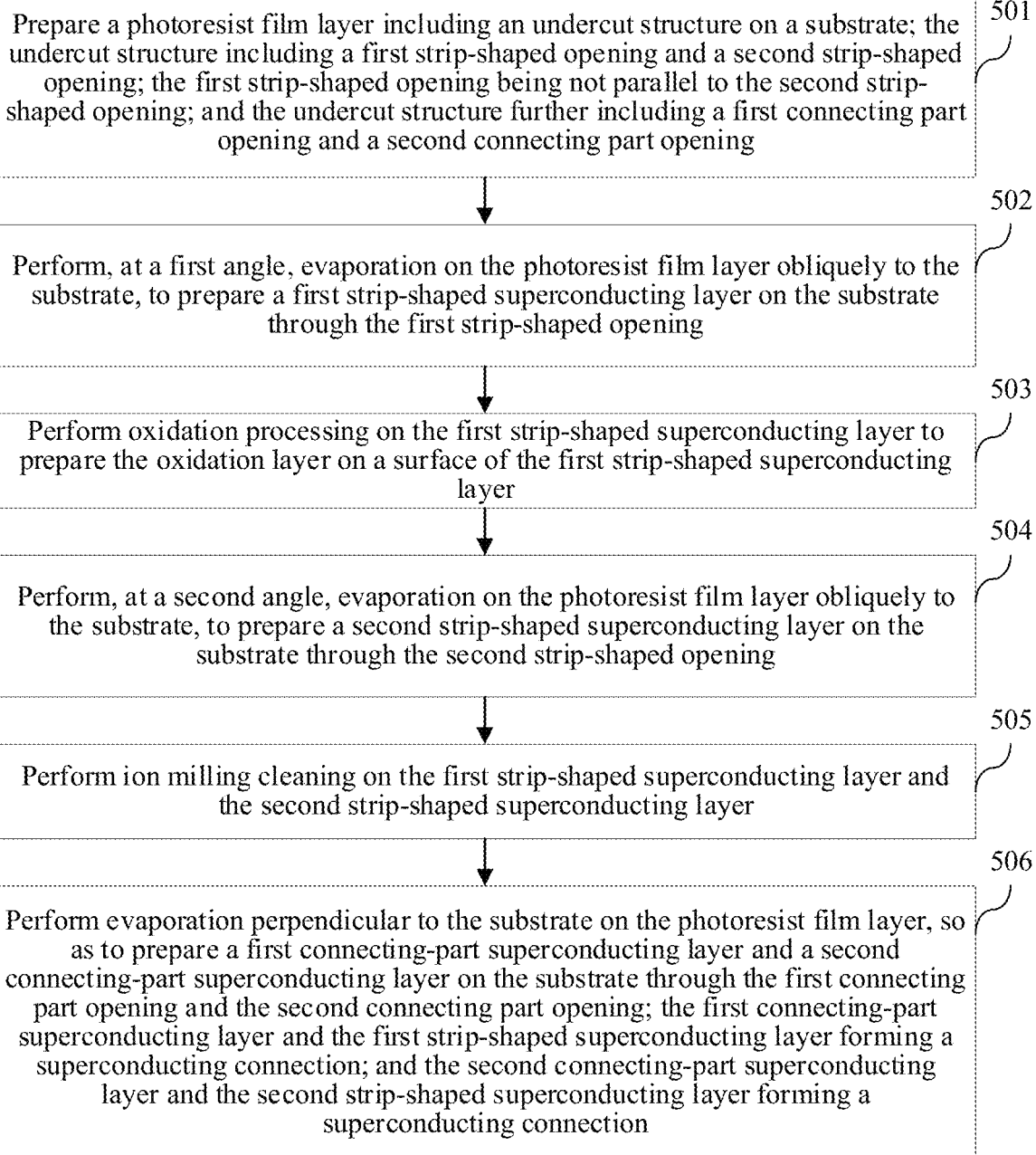
FIG. 5 is a flowchart of a method for preparing a Josephson junction according to an exemplary embodiment of this disclosure.

Referring to FIG. 5, FIG. 5 is a method flowchart of a method for preparing a Josephson junction according to an exemplary embodiment of this disclosure. The method may be performed by a production line device. As shown in FIG. 5, the method may include the following steps:

Step 501: Prepare a photoresist film layer including an undercut structure on a substrate; the undercut structure including a first strip-shaped opening and a second strip-shaped opening; and the first strip-shaped opening being not parallel to the second strip-shaped opening. The undercut structure further includes a first connecting part opening and a second connecting part opening.

In an exemplary implementation, an extension direction of the first strip-shaped opening is perpendicular to an extension direction of the second strip-shaped opening.

The extension direction of the strip-shaped opening may be a direction in which a straight line segment between two ends of the strip-shaped opening continues to extend to one end/two ends.

To facilitate a circuit design of a quantum bit assembly, the extension direction of the first strip-shaped opening and the extension direction of the second strip-shaped opening may be set to be perpendicular, so that two strip-shaped superconducting layers that cross to form a Josephson junction and that are subsequently prepared are also perpendicular to each other.

In another exemplary implementation, the extension direction of the first strip-shaped opening and the extension direction of the second strip-shaped opening may also be at an angle other than 90°, for example, 45°, 60°, or 80°.

In addition to the two strip-shaped openings, the undercut structure further includes a first connecting part opening and a second connecting part opening, where the first connecting part opening and the second connecting part opening are used for subsequently preparing Josephson junction patches separately connected to the two strip-shaped superconducting layers forming the Josephson junction.

In an exemplary implementation, the preparing a photoresist film layer including an undercut structure on a substrate includes:

S501a. Spin-coat a first photoresist of a first thickness on the substrate.

S501b. Perform solidification processing on the first photoresist.

S501c. Spin-coat a second photoresist of a second thickness on an upper layer of the first photoresist.

S501d. Perform solidification processing on the second photoresist.

In this embodiment of this disclosure, a layer of first photoresist may be first spin-coated on the substrate, and the first photoresist is solidified by means of solidification processing, for example, baking processing. Then a layer of second photoresist is spin-coated on an upper layer of the first photoresist, and the second photoresist is solidified by means of solidification processing. In this way, a double-layer photoresist can be prepared on the substrate.

The first photoresist and the second photoresist are photoresists of different materials.

In this embodiment of this disclosure, the first photoresist is located at a lower layer of the second photoresist, and an undercut structure needs to be prepared. Therefore, subsequently, the first photoresist needs to be exposed when the second photoresist is retained. Therefore, in this embodiment of this disclosure, the first photoresist may more easily reach an exposure condition than the second photoresist.

S501e. Perform electron beam exposure on the second photoresist in regions of the first strip-shaped opening and the second strip-shaped opening.

S501f. Perform electron beam exposure on the first photoresist and the second photoresist in regions of the first connecting part opening and the second connecting part opening.

S501g. Perform, in a region of the undercut structure, electron beam exposure on the first photoresist in a region other than the first connecting part opening and the second connecting part opening.

In this embodiment of this disclosure, for an undercut structure that needs to be prepared and that includes a strip-shaped opening and a connecting part opening, a lithography machine may separately use exposure processing of different degrees for the strip-shaped opening, the connecting part opening, and another part of the undercut structure (that is, a cavity part that is blocked above), so that the foregoing three different positions have different exposure effects.

For example, In an exemplary implementation, the lithography machine may first perform exposure on the first photoresist, and an exposure region includes another region in the undercut structure except the connecting part opening. Then, the lithography machine performs exposure on the second photoresist, and an exposure region includes a region corresponding to the strip-shaped opening. After the foregoing two times of exposure, a region of the connecting part opening is not exposed. In this case, the lithography machine may simultaneously expose the first photoresist and the second photoresist in the region of the connecting part opening.

For another example, the plurality of exposure steps may also be simultaneously performed by the lithography machine, that is, the lithography machine may simultaneously expose the first photoresist in the region other than the connecting part opening in the undercut structure, the second photoresist in the region corresponding to the strip-shaped opening, and the first photoresist and the second photoresist in the region of the connecting part opening.

S501h. Develop the first photoresist and the second photoresist that are obtained after electron beam exposure, to obtain the photoresist film layer including the undercut structure.

After the exposure step of S501g, an operator or an operation device (for example, the production line device) may perform developing processing on the photoresist on the substrate, to remove the exposed photoresist, and leave the photoresist film layer including the undercut structure.

In an exemplary implementation, the developing the first photoresist and the second photoresist that are obtained after electron beam exposure, to obtain the photoresist film layer including the undercut structure includes:

placing the exposed first photoresist and the exposed second photoresist into a developing solution for developing; and cleaning, by using oxygen plasma, the photoresist after lithographic development remaining on the substrate, to obtain the photoresist film layer including the undercut structure.

In this embodiment of this disclosure, when developing processing is performed on the exposed photoresist, the exposed first photoresist and the exposed second photoresist may be first placed in a developing solution for development for a period of time, to remove most of the exposed photoresist, and the remaining developed photoresist may be further cleaned by using oxygen plasma.

Step 502: Perform, at a first angle, evaporation on the photoresist film layer obliquely to the substrate, to prepare a first strip-shaped superconducting layer on the substrate of the undercut structure through the first strip-shaped opening.

In this embodiment of this disclosure, the undercut structure further includes a second strip-shaped opening. Therefore, in a process of performing, at the first angle, evaporation on the photoresist film layer obliquely to the substrate, a third strip-shaped superconducting layer is further prepared on the substrate of the undercut structure by using the second strip-shaped opening.

Because the first strip-shaped opening and the second strip-shaped opening do not intersect, for oblique evaporation at the same angle, two strip-shaped superconducting layers prepared on the substrate of the undercut structure through the two strip-shaped openings also do not intersect.

Step 503: Perform oxidation processing on the first strip-shaped superconducting layer to prepare the oxidation layer on a surface of the first strip-shaped superconducting layer.

In this embodiment of this disclosure, a Josephson junction to be prepared includes two parts of superconducting materials and an insulating layer between the two parts of superconducting materials. Therefore, before the second strip-shaped superconducting layer is prepared, an oxidation layer may be first prepared on a surface of the first strip-shaped superconducting layer to serve as an insulating layer in the Josephson junction.

Step 504: Perform, at a second angle, evaporation on the photoresist film layer obliquely to the substrate, to prepare a second strip-shaped superconducting layer on the substrate of the undercut structure through the second strip-shaped opening;

the first strip-shaped superconducting layer and the second strip-shaped superconducting layer crossing each other; and an intersection of the first strip-shaped superconducting layer and the second strip-shaped superconducting layer being isolated by an oxidation layer to form a Josephson junction.

Similarly, in a process of performing, at the second angle, evaporation on the photoresist film layer obliquely to the substrate, a fourth strip-shaped superconducting layer is further prepared on the substrate of the undercut structure through the first strip-shaped opening.

In this embodiment of this disclosure, the third strip-shaped superconducting layer does not intersect the first strip-shaped superconducting layer and the second strip-shaped superconducting layer, and correspondingly, the fourth strip-shaped superconducting layer does not intersect the first strip-shaped superconducting layer and the second strip-shaped superconducting layer.

That is, in this embodiment of this disclosure, after the two strip-shaped openings on the undercut structure are respectively subjected to oblique evaporation at two angles, four strip-shaped superconducting layers are formed on the substrate, including the first strip-shaped superconducting layer and the second strip-shaped superconducting layer that intersect each other, and the independent third strip-shaped superconducting layer and the independent fourth strip-shaped superconducting layer. The first strip-shaped superconducting layer and the second strip-shaped superconducting layer that intersect each other are used for forming a Josephson junction, and the third strip-shaped superconducting layer and the fourth strip-shaped superconducting layer are not to be connected to a quantum bit assembly.

Step 505: Perform ion milling cleaning on the first strip-shaped superconducting layer and the second strip-shaped superconducting layer.

In this embodiment of this disclosure, the production line device may perform ion milling cleaning on an overlapping region of the first strip-shaped superconducting layer and the projection of the first connecting part opening on the substrate, and an overlapping region of the second strip-shaped superconducting layer and the projection of the second connecting part opening on the substrate.

In this embodiment of this disclosure, a subsequently Josephson junction patch needs to form a superconducting connection to the Josephson junction, an oxidation step exists in a process of preparing the Josephson junction, that is, an oxidation layer exists on a surface of the first strip-shaped superconducting layer. Therefore, in this embodiment of this disclosure, before the Josephson junction patch is prepared, ion milling cleaning is first performed on the prepared first strip-shaped superconducting layer and the prepared second strip-shaped superconducting layer, to remove the oxidation layer on the surface of the first strip-shaped superconducting layer.

In addition, for the third strip-shaped superconducting layer and the fourth strip-shaped superconducting layer that are additionally obtained in the foregoing superconducting layer preparation process, when oxidation processing is performed in step 503, an oxidation layer is also prepared on surfaces of the third strip-shaped superconducting layer and the fourth strip-shaped superconducting layer.

In this step, a direction of ion milling cleaning may be a direction perpendicular to the substrate, and correspondingly, a cleaned region includes a region that is not blocked by the photoresist in the vertical direction, that is, a region in which the first strip-shaped superconducting layer overlaps a vertical projection of the first connecting part opening on the substrate (that is, a region in which the vertical projection of the first connecting part opening on the substrate overlaps the first strip-shaped superconducting layer on the substrate), a region in which the second strip-shaped superconducting layer overlaps a vertical projection of the second connecting part opening on the substrate (that is, a region in which the vertical projection of the second connecting part opening on the substrate overlaps the second strip-shaped superconducting layer on the substrate), a region of a vertical projection of the third strip-shaped superconducting layer on the substrate, and a region of a vertical projection of the fourth strip-shaped superconducting layer on the substrate.

Step 506: Perform evaporation perpendicular to the substrate on the photoresist film layer, so as to prepare a first connecting-part superconducting layer and a second connecting-part superconducting layer on the substrate of the undercut structure through the first connecting part opening and the second connecting part opening; the first connecting-part superconducting layer and the first strip-shaped superconducting layer forming a superconducting connection; and the second connecting-part superconducting layer and the second strip-shaped superconducting layer forming a superconducting connection.

In this embodiment of this disclosure, the position of the vertical projection of the first connecting part opening on the substrate intersects the first strip-shaped superconducting layer, and the position of the vertical projection of the second connecting part opening on the substrate also intersects the second strip-shaped superconducting layer. This may be implemented by designing the first angle and the second angle. In this design, when evaporation perpendicular to the substrate is performed on the photoresist film layer, the evaporated superconducting material may be used for preparing, on the substrate of the undercut structure, the first connecting-part superconducting layer that forms a superconducting connection to the first strip-shaped superconducting layer, and a second connecting-part superconducting layer that forms a superconducting connection to the second strip-shaped superconducting layer.

In this embodiment of this disclosure, because ion milling cleaning has been performed on the superconducting layer on the substrate before vertical evaporation, no new Josephson junction is formed on the substrate after vertical evaporation, that is, no parasitic junction is introduced.

In an exemplary implementation, an execution environment of the steps (that is, step 502 to step 506) from performing, at the first angle, evaporation on the photoresist film layer obliquely to the substrate (also referred to as oblique evaporation) to performing evaporation perpendicular to the substrate on the photoresist film layer (also referred to as straight evaporation) is an in situ environment.

Figure 6:
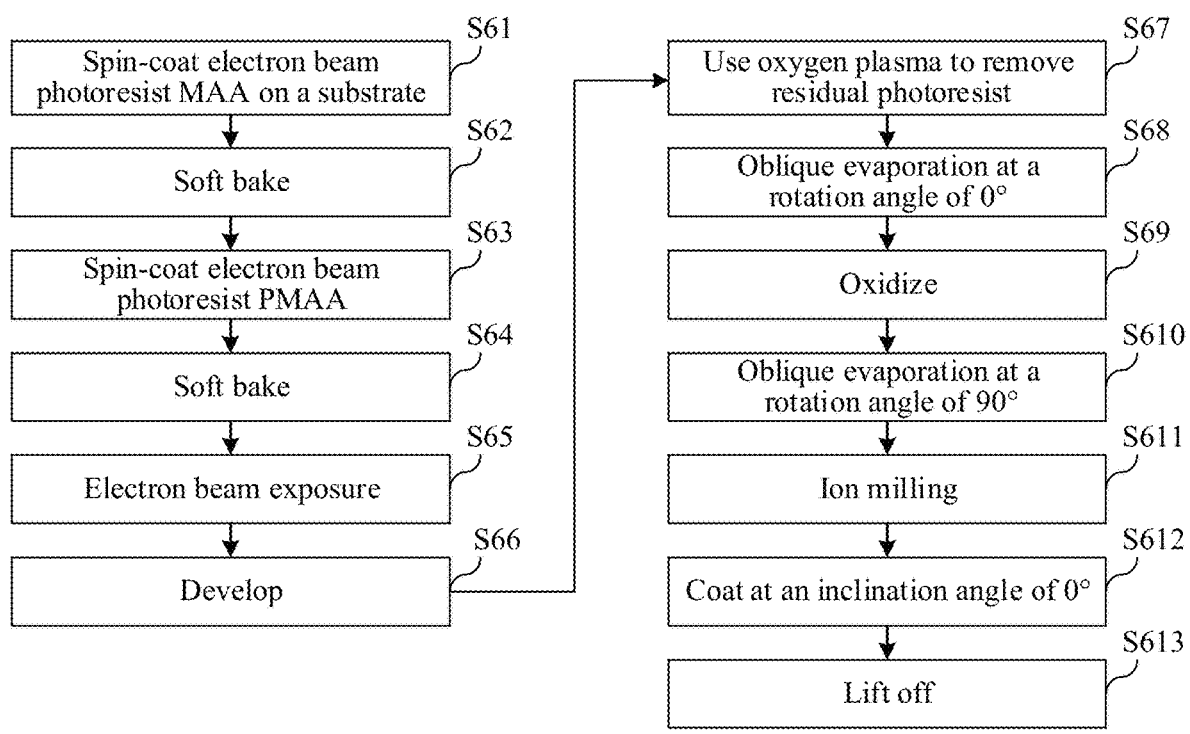
FIG. 6 is a process flow diagram of preparing a Josephson junction according to the embodiment shown in FIG. 5.

Referring to FIG. 6, FIG. 6 is a process flowchart of preparing a Josephson junction according to an embodiment of this disclosure. As shown in FIG. 6, in the solution shown in this embodiment of this disclosure, a Josephson junction is prepared in a manner of designing a shadow evaporation. As shown in FIG. 6, an example in which two strip-shaped openings are perpendicular to each other is used. A specific process thereof may be as follows:

S61. Spin-coat a layer of electron beam photoresist MAA with a thickness of t_M on a silicon or sapphire substrate.

S62. Soft bake at 180° C. for 7 min to solidify the photoresist.

S63. Spin-coat a layer of electron beam photoresist PMMA with a thickness of t_P on this basis.

S64. Soft bake at 180° C. for 2 min to solidify the photoresist, to form a double-layer adhesive structure.

S65. Perform electron beam exposure.

An electron beam exposure dose may be as follows:

An exposure dose of the PMMA photoresist in the strip-shaped opening region is 450 µC/cm^2. An exposure dose of the MAA photoresist in the region of the undercut structure except the connecting part opening is 150 µC/cm^2. An exposure dose of the PMMA+MAA photoresist in the region of the connecting part opening is 800 µC/cm^2.

By using the foregoing electron beam exposure processing, exposure may be performed on the PMMA+MAA photoresist in the regions of the strip-shaped opening and the connecting part opening, and MAA in other regions in the undercut structure.

S66. Develop for 1 min with a developing solution of MIBK:IPA=1:3, and then fix for 0.5 min with IPA, so as to form an undercut structure.

S67. After the development, use oxygen plasma with a power of 200 W to clean for 2 min, so as to remove a small amount of residual photoresist in the graphic region after the development.

Then, a sample with a graphic structure is put into a vacuum chamber that integrates ion milling, oxidation, and multi-angle coating functions for vacuuming.

S68. Evaporate 60 nm superconducting metal at a rotation angle of 0° and an inclination angle of 0.

S69. Adjust oxidation time according to a required junction resistance after the inclination angle is restored to 0°.

S610. After oxidation ends, 60 nm superconducting metal is evaporated at a rotation angle of 90° and an inclination angle of θ. to form a metal/oxidation layer/metal sandwich structure, that is, a Josephson junction.

S611. After a junction region is formed, clean for 3 min via ion milling.

For example, in the ion milling process, an angle 30° between an ion incident direction and a substrate normal direction may be set, and a substrate rotation rate 10 rpm may be set. The purpose of ion milling is to remove an oxidation layer on a surface of an external circuit.

S612. Finally, straightly evaporate 100 nm superconducting metal at an inclination angle of 0° and a rotation angle of any angle to form a Josephson junction bandage/patch connecting the Josephson junction and an external circuit.

S613. Lift off the photoresist to obtain the Josephson junction and the Josephson junction patch.

Based on the solution shown in FIG. 6, In an exemplary implementation, the first connecting part opening is not connected to the first strip-shaped opening, and the second connecting part opening is not connected to the second strip-shaped opening;

a projection of an evaporation direction at the first angle on the substrate is perpendicular to an extension direction of the first strip-shaped opening; and a projection of an evaporation direction at the second angle on the substrate is perpendicular to an extension direction of the second strip-shaped opening.

The first strip-shaped superconducting layer and a projection of the first strip-shaped opening on the substrate do not intersect; and the second strip-shaped superconducting layer and a projection of the second strip-shaped opening on the substrate do not intersect.

Figure 7:
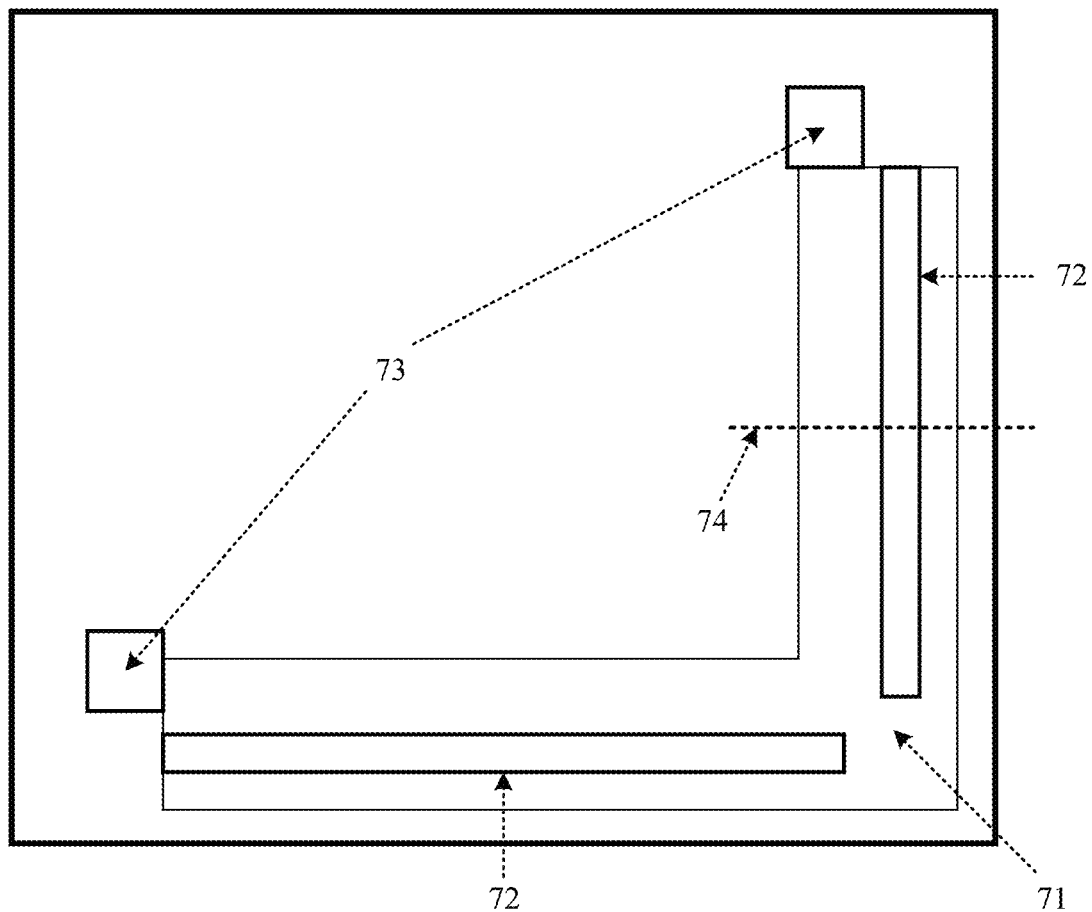
FIG. 7 is a pattern of electron beam exposure according to the embodiment shown in FIG. 5.

Referring to FIG. 7, FIG. 7 shows a pattern used for electron beam exposure according to an embodiment of this disclosure. As shown in FIG. 7, a region 71 indicates a region in which an electron beam photoresist at an MAA layer disappears after development, a region 72 indicates a region in which an electron beam photoresist at a PMMA layer disappears after development, and a region 73 indicates a region in which an electron beam photoresist at a PMMA+MAA layer disappears after development. The remaining blank region indicates a region in which both PMMA and MAA remain after development.

Figure 8:
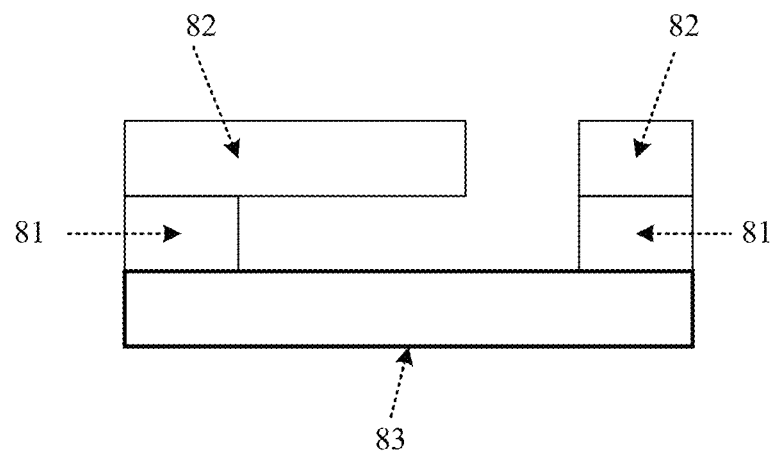
FIG. 8 is a cross-sectional view of an undercut structure according to the embodiment shown in FIG. 5.

Based on FIG. 7, referring to FIG. 8, FIG. 8 is a cross-sectional view of an undercut structure according to an embodiment of this disclosure. As shown in FIG. 8, the section is a section at a tangent 74 in FIG. 7.

A region 81 represents a MAA layer electron beam photoresist that remains after development, a region 82 represents a PMMA layer electron beam photoresist that remains after development, and a region 83 represents a substrate. After electron beam exposure and development, an undercut structure is obtained by using patterns of the PMMA layer and the MAA layer, that is, a region surrounded by the substrate and the photoresist in FIG. 8.

In this embodiment of this disclosure, a small quantity of residual electron beam photoresist in a surface exposure region of the substrate 83 is cleaned by using oxygen plasma, and the structure is put into a device that integrates ion milling, oxidation, and multi-angle coating functions for vacuuming. In a first step, a rotation angle may be set to 0°, and an inclination angle may be set to 0 for coating. The rotation angle being 0° may indicate a rotation angle at which an evaporation angle is perpendicular to an extension direction of a strip-shaped opening. Correspondingly, when two strip-shaped openings are perpendicular, and the rotation angle is 90°, the evaporation angle is perpendicular to an extension direction of another strip-shaped opening.

Figure 9:
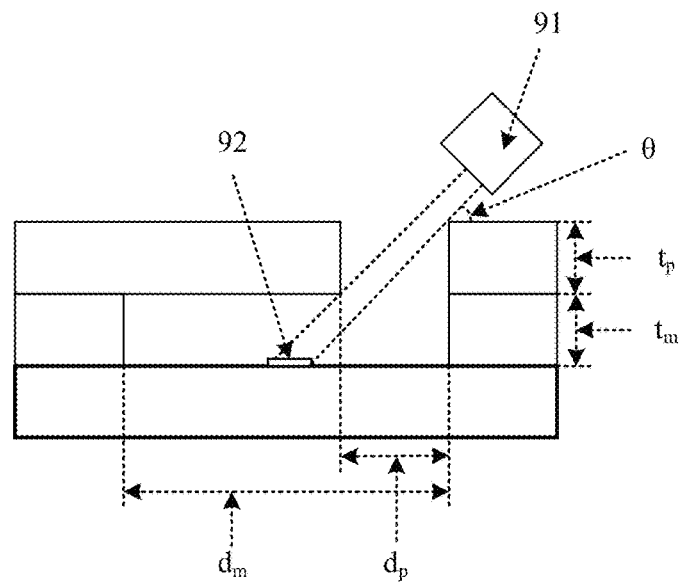
FIG. 9 is a schematic diagram of evaporation in the embodiment shown in FIG. 5.

With reference to FIG. 8, FIG. 9 is a schematic diagram of evaporation according to an embodiment of this disclosure. As shown in FIG. 9, an evaporation source 91 with a rotatable angle is added on the basis of FIG. 8. It is assumed that a width of an MAA graphics definition layer 81 is d_M, and a width of a PMMA graphics definition layer 82 is d_P, to prepare a Josephson junction that meets a condition, the following needs to be met: d_M>(t_P+t_M)tan θ>d_P>t_P·tan θ.

Therefore, a width of the Josephson junction 92 is defined as d_P−t_P·tan θ, and the width of the Josephson junction may be adjusted by adjusting the angle θ on the basis of meeting the foregoing relationship.

After oxidation, the substrate is rotated by 90°, and similarly, the angle of θ can be adjusted to control a length of the Josephson junction. In addition, to ensure that the Josephson junction bandage/patch does not form in the foregoing process, the following condition needs to be met: (t_P+t_M)tan θ>d_(P+M), where d_(P+M) is the width of the PMMA+MAA graphics definition layer 73.

With reference to FIG. 7, after the junction region of the Josephson junction is formed, an oxidation layer of an external circuit that is exposed in the region 73 is removed by using ion milling, then the inclination angle is set to 0°, and the rotation angle is set to any angle. A superconducting material is evaporated to form a Josephson junction bandage/patch.

Figure 10:
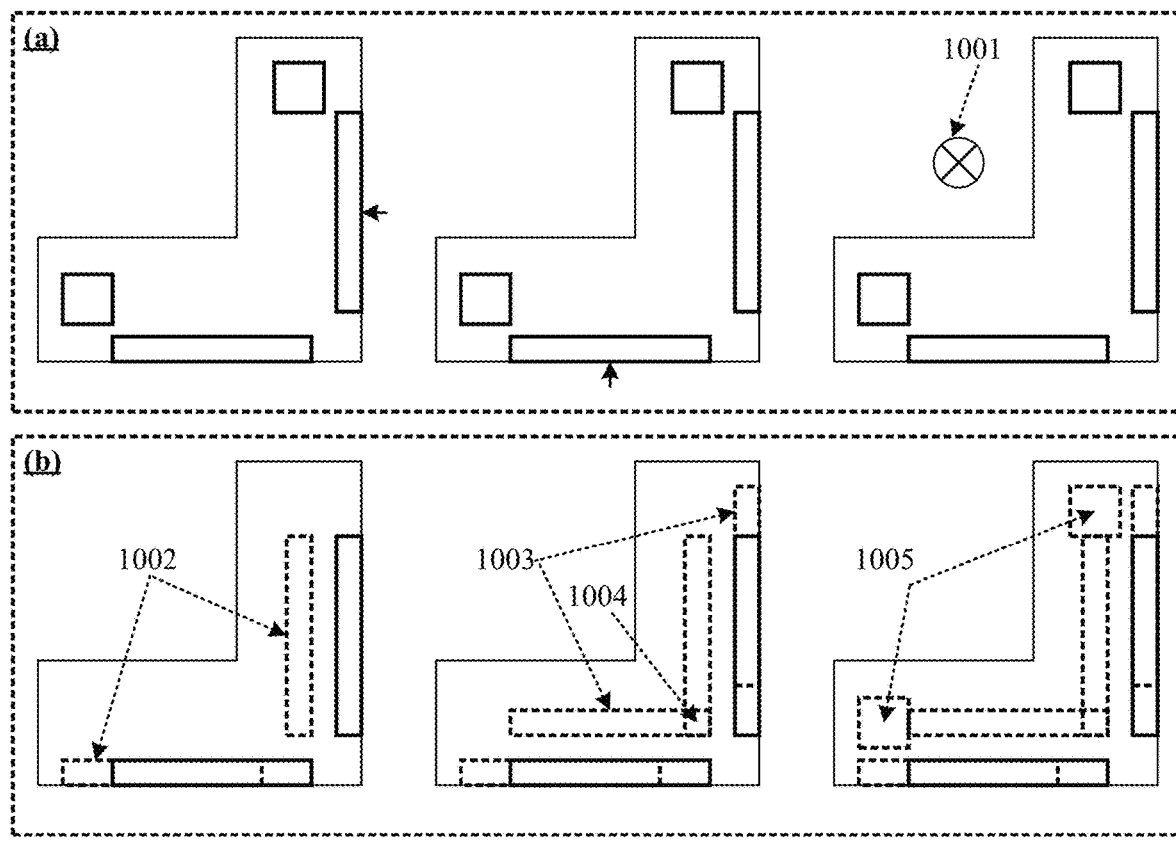
FIG. 10 is a schematic diagram of three times of coating processes in the embodiment shown in FIG. 5.

With reference to FIG. 7, FIG. 10 is a schematic diagram of three times of coating processes according to an embodiment of this disclosure. As shown in part (a) in FIG. 10, a vertical evaporation identifier 1001 indicates that a superconducting film layer is evaporated along a direction perpendicular to a paper surface.

Corresponding to the three times of coating processes in FIG. 10, an effect obtained is shown in part (b) in FIG. 10, where a region 1002 represents a circuit formed after the first time of coating, a region 1003 represents a circuit formed after the second time of coating, a region 1004 represents a formed Josephson junction, and a region 1005 represents a Josephson junction bandage/patch formed after the third time of coating.

Figure 11:
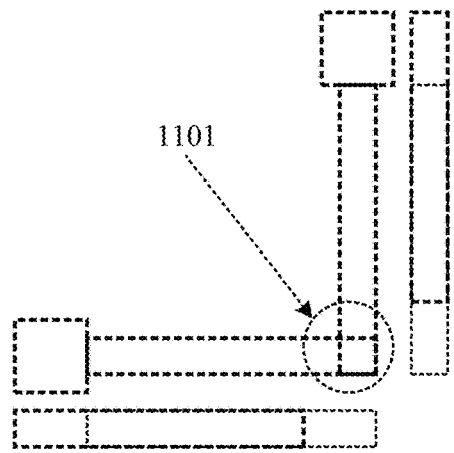
FIG. 11 is an effect diagram of lifting off a photoresist according to the embodiment shown in FIG. 5.

With reference to FIG. 10, FIG. 11 shows an effect diagram after a photoresist is lifted off according to an embodiment of this disclosure. The dashed block 1101 is a prepared Josephson junction.

In an exemplary implementation, the first connecting part opening is connected to one end of the first strip-shaped opening, and the second connecting part opening is connected to one end of the second strip-shaped opening;

a projection of an evaporation direction at the first angle on the substrate is parallel to a direction in which the first strip-shaped opening extends from the first connecting part opening to the other end of the first strip-shaped opening; and a projection of an evaporation direction at the second angle on the substrate is parallel to a direction in which the second strip-shaped opening extends from the second connecting part opening to the other end of the second strip-shaped opening.

That the projection of the evaporation direction at the first angle on the substrate is parallel to the direction in which the first strip-shaped opening extends from the first connecting part opening to the other end of the first strip-shaped opening means that a direction obtained by projecting the evaporation direction at the first angle on the substrate is parallel to the direction in which the first strip-shaped opening extends from the first connecting part opening to the other end of the first strip-shaped opening, and also means that the projection of the evaporation direction at the first angle on the substrate is the same as the extension direction of the first strip-shaped opening from the first connecting part opening to the other end of the first strip-shaped opening.

Correspondingly, that the projection of the evaporation direction at the second angle on the substrate is parallel to the direction in which the second strip-shaped opening extends from the second connecting part opening to the other end of the second strip-shaped opening means that a direction obtained by projecting the evaporation direction at the second angle on the substrate is parallel to the direction in which the second strip-shaped opening extends from the second connecting part opening to the other end of the second strip-shaped opening, and also means that the projection of the evaporation direction at the second angle on the substrate is the same as the extension direction of the second strip-shaped opening from the second connecting part opening to the other end of the second strip-shaped opening.

In the solution shown in this embodiment of this disclosure, the position of the junction region of the Josephson junction is defined under a hollow photoresist structure by using the shadow evaporation method, so as to avoid damage to the Josephson junction caused by ion bombardment. Therefore, in addition to the implementation solutions shown in FIG. 7 to FIG. 10, the Josephson junction may be implemented by using another similar solution, provided that the Josephson junction is prepared under the upper-layer photoresist in the undercut structure in a manner of oblique evaporation. The following provides an exemplary alternative implementation.

Figure 12:
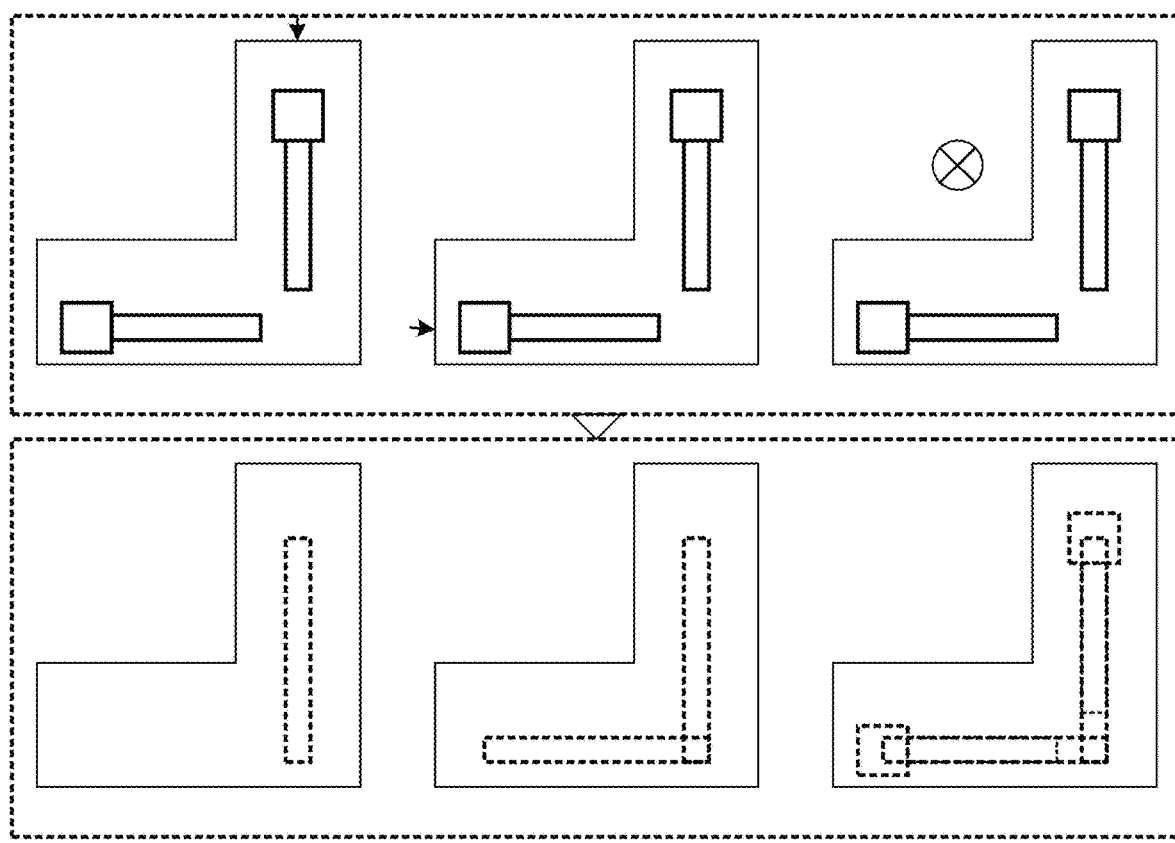
FIG. 12 is a schematic diagram of an undercut pattern and three times of coating processes in the embodiment shown in FIG. 5.

Referring to FIG. 12, FIG. 12 is a schematic diagram of an undercut pattern and three times of coating processes according to an embodiment of this disclosure. As shown in FIG. 12, the section shown in FIG. 8 is still used as an example. Requirements for an evaporation angle and an opening size of the section are as follows: t_P·tan θ>d_P, and (t_P+t_M)tan θ>d_(P+M).

As shown in FIG. 12, for the first time of evaporation, a rotation angle is set to 90°, and an inclination angle θ is set to any value that meets the foregoing requirements. For the second time of evaporation, the rotation angle is set to 0°, and the inclination angle θ is set to any value that meets the foregoing requirements. The first two times of evaporation form a Josephson junction. Then, ion milling is performed to remove an oxidation layer in contact with an external circuit. For the third time of evaporation, the rotation angle is set to any angle, and the inclination angle is set to 0°, to form a Josephson junction patch/bandage.

Figure 13:
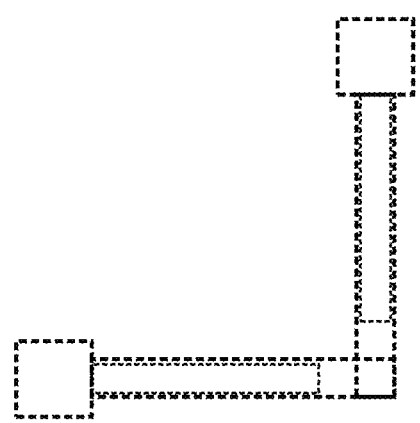
FIG. 13 is an effect diagram of lifting off a photoresist according to the embodiment shown in FIG. 5.

With reference to FIG. 12, referring to FIG. 13, FIG. 13 is an effect diagram after a photoresist is lifted off according to an embodiment of this disclosure.

According to the solution shown in the foregoing embodiment of this disclosure, the following effects may be achieved:

1) Elimination of parasitic junctions from the Josephson junction preparation process.
2) Elimination of damage to the substrate surface by ion milling, and improvement in contact between the superconducting film layer and the substrate interface.
3) Combination of functions of the Josephson junction bandage and the Josephson junction patch, completion of preparation of the Josephson junction and the Josephson junction bandage/patch in situ, and simplification of the technological process.
4) Protection for the Josephson junction from ion bombardment and reduction in the risk of breakdown of the Josephson junction.
5) Adjustable size of the Josephson junction by selecting the coating angle.
6) This solution is also applicable to an ultraviolet photoresist structure with a minimum resolution of about 1 μm, such as ultraviolet exposure or laser direct writing, to prepare a nanoscale Josephson junction.

In conclusion, in the solution shown in this embodiment of this disclosure, a photoresist film layer with an undercut structure that has two non-parallel strip-shaped openings is prepared on a substrate, and two strip-shaped superconducting layers that cross each other and are isolated by an oxidation layer are prepared on the substrate in the undercut structure by means of oblique evaporation at two different angles. In the foregoing solution, only one Josephson junction is formed at an intersection of two strip-shaped superconducting layers, and another parasitic junction is not brought, thereby improving coherence of a quantum bit assembly.

Figure 14:
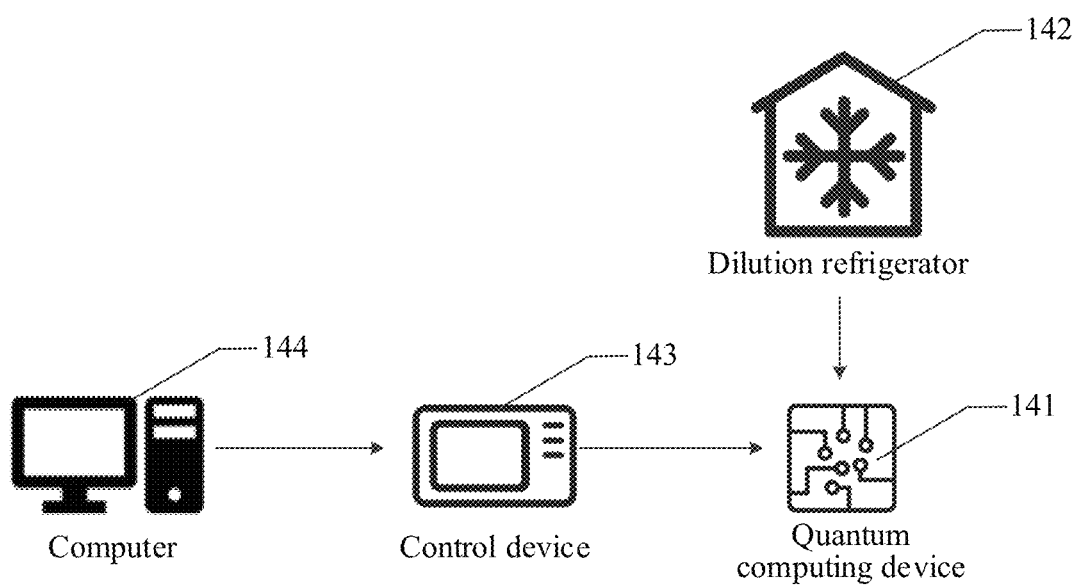
FIG. 14 is a schematic diagram of an application scenario of a solution according to an embodiment of this disclosure.

Referring to FIG. 14, FIG. 14 is a schematic diagram of an application scenario of a solution according to an embodiment of this disclosure. As shown in FIG. 14, the application scenario may be a superconducting quantum computing platform, and the application scenario includes: a quantum computing device 141, a dilution refrigerator 142, a control device 143, and a computer 144.

The quantum computing device 141 is a circuit that acts on a physical quantum bit. The quantum computing device 141 may be implemented as a quantum chip, for example, a superconducting quantum chip that is near absolute zero. The dilution refrigerator 142 is configured to provide an absolute zero environment for a superconducting quantum chip. The physical quantum bit may be a Josephson junction prepared by using the method shown in the foregoing embodiment of this disclosure.

The control device 143 is configured to control the quantum computing device 141, and the computer 144 is configured to control the control device 143. For example, a compiled quantum program is interpreted by software in the computer 144 into an instruction and sent to the control device 143 (for example, an electronic/microwave control system), and the control device 143 converts the instruction into an electronic/microwave control signal and inputs the electronic/microwave control signal to the dilution refrigerator 142 to control a superconducting quantum bit at a temperature less than 10 mK. In contrast, a read waveform is transferred to the quantum computing device 141 in a reading process.

Figure 15:
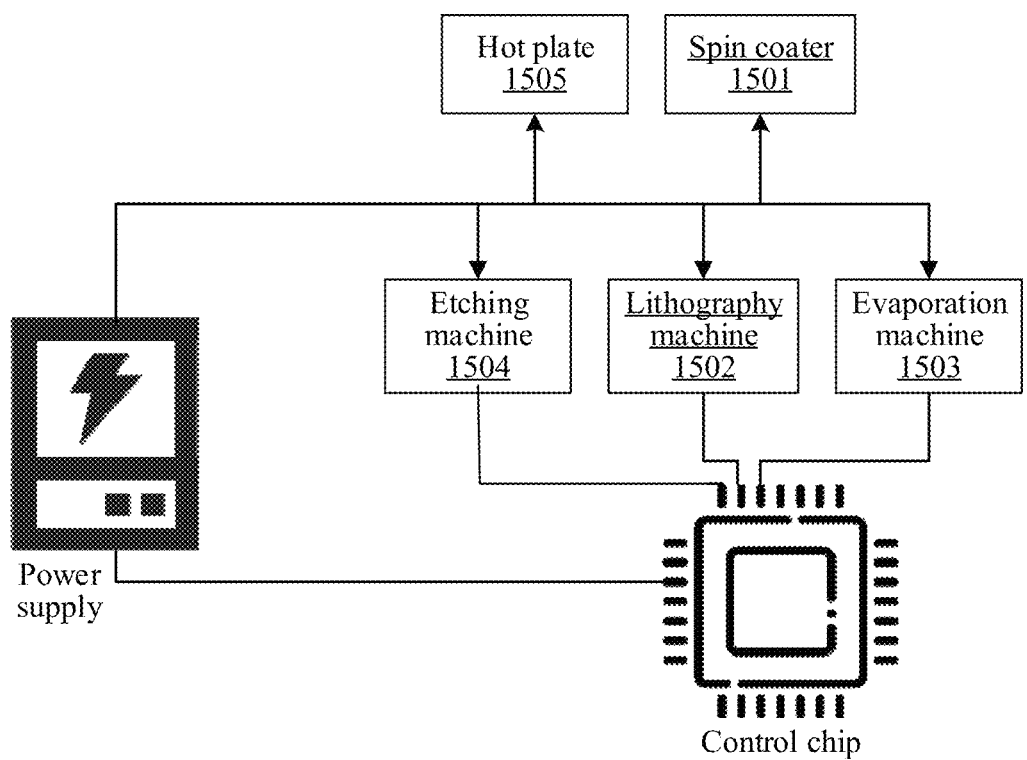
FIG. 15 is a schematic diagram of a production line device according to an exemplary embodiment of this disclosure.

FIG. 15 is a schematic diagram of a production line device according to an exemplary embodiment of this disclosure. As shown in FIG. 15, the production line device includes: a spin coater 1501, a lithography machine 1502, and an evaporation machine 1503;
the spin coater 1501 and the lithography machine 1502 are configured to prepare a photoresist film layer including an undercut structure on a substrate; the undercut structure including a first strip-shaped opening and a second strip-shaped opening; and the first strip-shaped opening being not parallel to the second strip-shaped opening;
the evaporation machine 1503 is configured to perform, at a first angle, evaporation on the photoresist film layer obliquely to the substrate, to prepare a first strip-shaped superconducting layer on the substrate of the undercut structure through the first strip-shaped opening; and
the evaporation machine 1503 is further configured to perform, at a second angle, evaporation on the photoresist film layer obliquely to the substrate, to prepare a second strip-shaped superconducting layer on the substrate of the undercut structure through the second strip-shaped opening; the first strip-shaped superconducting layer intersecting the second strip-shaped superconducting layer; and an intersection of the first strip-shaped superconducting layer and the second strip-shaped superconducting layer being isolated by an oxidation layer to form a Josephson junction.

In an exemplary implementation, in a process of performing, at the first angle, evaporation on the photoresist film layer obliquely to the substrate, the evaporation machine 1503 is further configured to prepare a third strip-shaped superconducting layer on the substrate of the undercut structure through the second strip-shaped opening; and
the third strip-shaped superconducting layer does not intersect the first strip-shaped superconducting layer and the second strip-shaped superconducting layer.

In an exemplary implementation, in a process of performing, at the second angle, evaporation on the photoresist film layer obliquely to the substrate, the evaporation machine 1503 is further configured to prepare a fourth strip-shaped superconducting layer on the substrate of the undercut structure through the first strip-shaped opening; and
the fourth strip-shaped superconducting layer does not intersect the first strip-shaped superconducting layer and the second strip-shaped superconducting layer.

In an exemplary implementation, the evaporation machine 1503 is further configured to: before performing, at the second angle, evaporation on the photoresist film layer obliquely to the substrate, perform oxidation processing on the first strip-shaped superconducting layer to prepare the oxidation layer on a surface of the first strip-shaped superconducting layer.

In an exemplary implementation, the first strip-shaped superconducting layer and a projection of the first strip-shaped opening on the substrate do not intersect; the second strip-shaped superconducting layer and a projection of the second strip-shaped opening on the substrate do not intersect; the undercut structure further includes a first connecting part opening and a second connecting part opening; and
the evaporation machine 1503 is further configured to perform evaporation perpendicular to the substrate on the photoresist film layer, so as to prepare a first connecting-part superconducting layer and a second connecting-part superconducting layer on the substrate of the undercut structure through the first connecting part opening and the second connecting part opening; the first connecting-part superconducting layer and the first strip-shaped superconducting layer forming a superconducting connection; and the second connecting-part superconducting layer and the second strip-shaped superconducting layer forming a superconducting connection.

In an exemplary implementation, an extension direction of the first strip-shaped opening is perpendicular to an extension direction of the second strip-shaped opening.

In an exemplary implementation, the first connecting part opening is not connected to the first strip-shaped opening, and the second connecting part opening is not connected to the second strip-shaped opening;

a projection of an evaporation direction at the first angle on the substrate is perpendicular to an extension direction of the first strip-shaped opening; and a projection of an evaporation direction at the second angle on the substrate is perpendicular to an extension direction of the second strip-shaped opening.

In an exemplary implementation, the first connecting part opening is connected to one end of the first strip-shaped opening, and the second connecting part opening is connected to one end of the second strip-shaped opening;

a projection of an evaporation direction at the first angle on the substrate is parallel to a direction in which the first strip-shaped opening extends from the first connecting part opening to the other end of the first strip-shaped opening; and a projection of an evaporation direction at the second angle on the substrate is parallel to a direction in which the second strip-shaped opening extends from the second connecting part opening to the other end of the second strip-shaped opening.

As shown in FIG. 15, In an exemplary implementation, the production line device further includes: an etching machine 1504; and the etching machine 1504 is configured to: before the evaporation machine performs evaporation perpendicular to the substrate on the photoresist film layer, perform ion milling cleaning on an overlapping region of the first strip-shaped superconducting layer and the projection of the first connecting part opening on the substrate, and an overlapping region of the second strip-shaped superconducting layer and the projection of the second connecting part opening on the substrate.

In an exemplary implementation, the production line device further includes a hot plate 1505;

the spin coater 1501 is configured to spin-coat a first photoresist of a first thickness on the substrate;

the hot plate 1505 is configured to perform solidification processing on the first photoresist;

the spin coater 1501 is configured to spin-coat a second photoresist of a second thickness on an upper layer of the first photoresist;

the hot plate 1505 is configured to perform solidification processing on the second photoresist;

the lithography machine 1502 is configured to: perform electron beam exposure on the second photoresist in regions of the first strip-shaped opening and the second strip-shaped opening; perform electron beam exposure on the first photoresist and the second photoresist in regions of the first connecting part opening and the second connecting part opening; and perform, in a region of the undercut structure, electron beam exposure on the first photoresist in a region other than the first connecting part opening and the second connecting part opening; and the photoresist film layer including the undercut structure is obtained by developing the first photoresist and the second photoresist that are obtained after electron beam exposure.

In an exemplary implementation, the photoresist film layer including the undercut structure is obtained by placing the exposed first photoresist and the exposed second photoresist into a developing solution for development, and cleaning, by using oxygen plasma, the photoresist after lithographic development remaining on the substrate.

In an implementation, the production line device further includes a processor, and the processor may be separately electrically connected to the spin coater 1501, the lithography machine 1502, the evaporation machine 1503, the etching machine 1504, and the hot plate 1505, so as to control the spin coater 1501, the lithography machine 1502, the evaporation machine 1503, the etching machine 1504, the hot plate 1505, and the like.

In an implementation, the production line device further includes a power supply, to supply electric power to electrical devices such as the processor, the spin coater 1501, the lithography machine 1502, the evaporation machine 1503, the etching machine 1504, and the hot plate 1505.

In an implementation, a spatial connection is made between the machines by using a conveyor belt, or movement of a prepared product between the machines is completed based on a mechanical arm.

In an implementation, the production line device further includes a memory. The memory may be configured to store at least one computer instruction, and the processor executes the at least one computer instruction, so that the production line device performs the foregoing method for preparing a Josephson junction.

In an exemplary embodiment, a computer readable storage medium is further provided, where the computer readable storage medium stores at least one computer instruction, and the at least one computer instruction is executed by a processor in a production line device, so that the production line device performs the foregoing method for preparing a Josephson junction.

In an exemplary embodiment, a computer program product or a computer program is further provided. The computer program product or the computer program includes computer instructions, and the computer instructions are stored in a computer readable storage medium. A processor of a production line device reads the computer instructions from the computer readable storage medium, and the processor executes the computer instructions, so that the production line device performs the foregoing method for preparing a Josephson junction.

The term preparing may be understood as manufacturing, forming, creating, making, or other equivalent term.

What is claimed is:

1. A method for preparing a Josephson junction, comprising:

preparing a photoresist film layer comprising an undercut structure on a substrate, the undercut structure comprising a first strip-shaped opening and a second strip-shaped opening, and the first strip-shaped opening being not parallel to the second strip-shaped opening;

performing, at a first angle, evaporation on the photoresist film layer obliquely to the substrate, to prepare a first strip-shaped superconducting layer on the substrate through the first strip-shaped opening; and performing, at a second angle, evaporation on the photoresist film layer obliquely to the substrate, to prepare a second strip-shaped superconducting layer on the substrate through the second strip-shaped opening, the first strip-shaped superconducting layer and the second strip-shaped superconducting layer crossing each other, and an intersection of the first strip-shaped superconducting layer and the second strip-shaped superconducting layer being isolated by an oxidation layer to form a Josephson junction.

2. The method according to claim 1, wherein in a process of performing, at the first angle, evaporation on the photoresist film layer obliquely to the substrate, a third strip-shaped superconducting layer is further prepared on the substrate through the second strip-shaped opening, and the third strip-shaped superconducting layer does not intersect the first strip-shaped superconducting layer and the second strip-shaped superconducting layer.

3. The method according to claim 1, wherein in a process of performing, at the second angle, evaporation on the photoresist film layer obliquely to the substrate, a fourth strip-shaped superconducting layer is further prepared on the substrate of the undercut structure through the first strip-shaped opening, and the fourth strip-shaped superconducting layer does not intersect the first strip-shaped superconducting layer and the second strip-shaped superconducting layer.

4. The method according to claim 1, wherein the method further comprises:
performing oxidation processing on the first strip-shaped superconducting layer to prepare the oxidation layer on a surface of the first strip-shaped superconducting layer.

5. The method according to claim 1, wherein the first strip-shaped superconducting layer and a projection of the first strip-shaped opening on the substrate do not intersect, the second strip-shaped superconducting layer and a projection of the second strip-shaped opening on the substrate do not intersect, the undercut structure further comprises a first connecting part opening and a second connecting part opening, and the method further comprises:
performing evaporation perpendicular to the substrate on the photoresist film layer, to prepare a first connecting-part superconducting layer and a second connecting-part superconducting layer on the substrate of the undercut structure through the first connecting part opening and the second connecting part opening,
the first connecting-part superconducting layer and the first strip-shaped superconducting layer forming a superconducting connection, and
the second connecting-part superconducting layer and the second strip-shaped superconducting layer forming a superconducting connection.

6. The method according to claim 5, wherein the method further comprises:
performing ion milling cleaning on an overlapping region of the first strip-shaped superconducting layer and the projection of the first connecting part opening on the substrate, and an overlapping region of the second strip-shaped superconducting layer and the projection of the second connecting part opening on the substrate.

7. The method according to claim 6, wherein an execution environment for operations of performing evaporation is an in situ environment.

8. The method according to claim 5, wherein an extension direction of the first strip-shaped opening is perpendicular to an extension direction of the second strip-shaped opening.

9. The method according to claim 5, wherein the first connecting part opening is not connected to the first strip-shaped opening, and the second connecting part opening is not connected to the second strip-shaped opening;
a projection of an evaporation direction at the first angle on the substrate is perpendicular to an extension direction of the first strip-shaped opening; and
a projection of an evaporation direction at the second angle on the substrate is perpendicular to an extension direction of the second strip-shaped opening.

10. The method according to claim 5, wherein the first connecting part opening is connected to one end of the first strip-shaped opening, and the second connecting part opening is connected to one end of the second strip-shaped opening;

a projection of an evaporation direction at the first angle on the substrate is parallel to a direction in which the first strip-shaped opening extends from the first connecting part opening to the other end of the first strip-shaped opening; and
a projection of an evaporation direction at the second angle on the substrate is parallel to a direction in which the second strip-shaped opening extends from the second connecting part opening to the other end of the second strip-shaped opening.

11. The method according to claim 5, wherein the preparing the photoresist film layer comprises:
spin-coating a first photoresist of a first thickness on the substrate;
performing solidification processing on the first photoresist;
spin-coating a second photoresist of a second thickness on an upper layer of the first photoresist;
performing solidification processing on the second photoresist;
performing electron beam exposure on the second photoresist in regions of the first strip-shaped opening and the second strip-shaped opening;
performing electron beam exposure on the first photoresist and the second photoresist in regions of the first connecting part opening and the second connecting part opening;
performing, in a region of the undercut structure, electron beam exposure on the first photoresist in a region other than the first connecting part opening and the second connecting part opening; and
developing the first photoresist and the second photoresist that are obtained after electron beam exposure, to obtain the photoresist film layer comprising the undercut structure.

12. The method according to claim 11, wherein the developing the first photoresist and the second photoresist to obtain the photoresist film layer comprises:
placing the exposed first photoresist and the exposed second photoresist into a developing solution for developing; and
cleaning, with oxygen plasma, photoresist remaining on the substrate after lithographic development, to obtain the photoresist film layer comprising the undercut structure.

13. A device for preparing a Josephson junction, comprising:
a spin coater, a lithography machine, and an evaporation machine;
the spin coater and the lithography machine are configured to prepare a photoresist film layer comprising an undercut structure on a substrate, the undercut structure comprising a first strip-shaped opening and a second strip-shaped opening, and the first strip-shaped opening being not parallel to the second strip-shaped opening;
the evaporation machine is configured to perform, at a first angle, evaporation on the photoresist film layer obliquely to the substrate, to prepare a first strip-shaped superconducting layer on the substrate through the first strip-shaped opening; and
the evaporation machine is further configured to perform, at a second angle, evaporation on the photoresist film layer obliquely to the substrate, to prepare a second strip-shaped superconducting layer on the substrate through the second strip-shaped opening, the first strip-shaped superconducting layer intersecting the second strip-shaped superconducting layer, and an intersection of the first strip-shaped superconducting layer, and the second strip-shaped superconducting layer being isolated by an oxidation layer to form a Josephson junction.

14. The production line device according to claim 13, wherein the evaporation machine is further configured to prepare a third strip-shaped superconducting layer on the substrate through the second strip-shaped opening, and the third strip-shaped superconducting layer does not intersect the first strip-shaped superconducting layer and the second strip-shaped superconducting layer.

15. The production line device according to claim 13, wherein the evaporation machine is further configured to prepare a fourth strip-shaped superconducting layer on the substrate of the undercut structure through the first strip-shaped opening, and the fourth strip-shaped superconducting layer does not intersect the first strip-shaped superconducting layer and the second strip-shaped superconducting layer.

16. The production line device according to claim 13, wherein the evaporation machine is further configured to:
perform oxidation processing on the first strip-shaped superconducting layer to prepare the oxidation layer on a surface of the first strip-shaped superconducting layer.

17. The production line device according to claim 13, wherein the first strip-shaped superconducting layer and a projection of the first strip-shaped opening on the substrate do not intersect, the second strip-shaped superconducting layer and a projection of the second strip-shaped opening on the substrate do not intersect, the undercut structure further comprises a first connecting part opening and a second connecting part opening, and
the evaporation machine is further configured to perform evaporation perpendicular to the substrate on the photoresist film layer, to prepare a first connecting-part superconducting layer and a second connecting-part superconducting layer on the substrate through the first connecting part opening and the second connecting part opening,
the first connecting-part superconducting layer and the first strip-shaped superconducting layer forming a superconducting connection, and
the second connecting-part superconducting layer and the second strip-shaped superconducting layer forming a superconducting connection.

18. The production line device according to claim 17, wherein the production line device further comprises an etching machine; and
the etching machine is configured to perform ion milling cleaning on an overlapping region of the first strip-shaped superconducting layer and the projection of the first connecting part opening on the substrate, and an overlapping region of the second strip-shaped superconducting layer and the projection of the second connecting part opening on the substrate.

19. The production line device according to claim 17, wherein an extension direction of the first strip-shaped opening is perpendicular to an extension direction of the second strip-shaped opening.

20. The production line device according to claim 13, wherein the production line device further comprises a hot plate;
the spin coater is configured to spin-coat a first photoresist of a first thickness on the substrate;
the hot plate is configured to perform solidification processing on the first photoresist;
the spin coater is further configured to spin-coat a second photoresist of a second thickness on an upper layer of the first photoresist;
the hot plate is further configured to perform solidification processing on the second photoresist;
the lithography machine is configured to:
perform electron beam exposure on the second photoresist in regions of the first strip-shaped opening and the second strip-shaped opening;
perform electron beam exposure on the first photoresist and the second photoresist in regions of the first connecting part opening and the second connecting part opening; and
perform, in a region of the undercut structure, electron beam exposure on the first photoresist in a region other than the first connecting part opening and the second connecting part opening; and
the photoresist film layer comprising the undercut structure is obtained by developing the first photoresist and the second photoresist that are obtained after electron beam exposure.

* * * * *